United States Patent
Heisig et al.

(10) Patent No.: US 9,093,875 B2
(45) Date of Patent: Jul. 28, 2015

(54) DOWNHOLE APPARATUS FOR ELECTRICAL POWER GENERATION FROM SHAFT FLEXURE

(71) Applicant: Scientific Drilling International, Inc., Houston, TX (US)

(72) Inventors: Gerald Heisig, Spring, TX (US); William Beasley, Magnolia, TX (US)

(73) Assignee: Scientific Drilling International, Inc., Houston, TX (US)

( * ) Notice: Subject to any disclaimer, the term of this patent is extended or adjusted under 35 U.S.C. 154(b) by 431 days.

(21) Appl. No.: 13/656,185

(22) Filed: Oct. 19, 2012

(65) Prior Publication Data
US 2013/0099500 A1    Apr. 25, 2013

Related U.S. Application Data

(60) Provisional application No. 61/549,484, filed on Oct. 20, 2011.

(51) Int. Cl.
| | |
|---|---|
| H01L 41/00 | (2013.01) |
| F03B 13/00 | (2006.01) |
| H02K 7/18 | (2006.01) |
| H01L 41/12 | (2006.01) |
| H02N 2/18 | (2006.01) |
| E21B 41/00 | (2006.01) |
| E21B 4/02 | (2006.01) |
| H02K 35/06 | (2006.01) |

(52) U.S. Cl.
CPC .. *H02K 7/18* (2013.01); *E21B 4/02* (2013.01); *E21B 41/0085* (2013.01); *H01L 41/125* (2013.01); *H02K 7/1876* (2013.01); *H02N 2/185* (2013.01); *H02N 2/186* (2013.01); *H02K 35/06* (2013.01)

(58) Field of Classification Search
CPC ............ H01L 41/12; B06B 1/08; B06B 3/00; H03H 9/22; H04R 15/00
USPC ....................................... 310/26; 290/1 R, 54
See application file for complete search history.

(56) References Cited

U.S. PATENT DOCUMENTS

| | | |
|---|---|---|
| 5,248,896 A | 9/1993 | Forrest |
| 2009/0256532 A1 | 10/2009 | Ciglenec et al. |
| 2010/0133843 A1 | 6/2010 | Nair |
| 2012/0228877 A1* | 9/2012 | Samuel ........................... 290/54 |
| 2012/0228882 A1 | 9/2012 | Dirksen |
| 2013/0214619 A1* | 8/2013 | Nair et al. ....................... 310/17 |
| 2013/0328316 A1* | 12/2013 | Rodney et al. .................. 290/54 |
| 2014/0009007 A1* | 1/2014 | Murphree et al. .............. 310/26 |
| 2014/0167422 A1* | 6/2014 | Murphree et al. ............ 290/1 R |
| 2014/0239745 A1* | 8/2014 | Nair et al. ........................ 310/20 |

OTHER PUBLICATIONS

International Search Report and Written Opinion issued in PCT/US12/61097 mailed on Jan. 10, 2013, 7 pages.

* cited by examiner

*Primary Examiner* — Thomas Dougherty
(74) *Attorney, Agent, or Firm* — Adolph Locklar

(57) ABSTRACT

An apparatus and a method for generating electrical power are disclosed. The apparatus includes a mud motor including a rotor. The rotor is capable of eccentric motion and has a rotor end. The apparatus further includes an inverse magnetostrictive device having a magnetostrictive element. The magnetostrictive element has a flexing end that is affixed to the rotor end.

18 Claims, 4 Drawing Sheets

DOWNHOLE APPARATUS FOR ELECTRICAL POWER GENERATION FROM SHAFT FLEXURE

CROSS REFERENCE TO RELATED APPLICATION

This application claims priority to U.S. Provisional Patent Application No. 61/549,484 filed Oct. 20, 2011. This application is hereby incorporated by reference herein in its entirety.

FIELD

Embodiments of the present disclosure generally relate to downhole power generation within a borehole and specifically using flexure of a shaft to generate electrical power using inverse magnetostriction.

BACKGROUND

As the use of horizontal and directional drilling has grown, and more sensors and actuators are integrated into the drilling assemblies, the need for power in the borehole has also grown. Various types of equipment, from surveying to bit positioning, formation evaluation to fluid control all require some form of power. Numerous methods of transmitting power from the surface to devices within the borehole have been used, including placing cables in an annulus formed between the borehole and casing and using electrical conduction through the casing. Batteries have also been used. However the use of batteries within boreholes presents problems with respect to space and battery life, which can become particularly acute in high temperature boreholes. Various types of downhole power generation have been used. However, these methods often involve equipment that may be unwieldy, due to either length or circumference, or are underpowered for the power demand.

What is needed is a downhole power generation method and apparatus with an extended life time for generating electricity that is self-contained and can be proportioned for various boreholes.

SUMMARY

Embodiments of the present disclosure include methods and apparatuses for the downhole generation of electrical power.

In one embodiment of the present disclosure, an apparatus for generating electrical power is disclosed. The apparatus includes a mud motor; the mud motor includes a rotor capable of eccentric motion and has a rotor end. The apparatus further includes an inverse magnetostrictive device. The inverse magnetostrictive device includes a magnetostrictive element wherein the magnetostrictive element has a flexing end and wherein the flexing end of the magnetostrictive element is affixed to the rotor end.

In another embodiment of the present disclosure, a method for generating electrical power is disclosed. The method includes providing a mud motor. The mud motor has a rotor with a rotor end. The method further includes providing an inverse magnetostrictive device, where the inverse magnetostrictive device includes a magnetostrictive element. The magnetostrictive element has a flexing end which is affixed to the rotor end. The method also includes rotating the rotor, wherein the rotation of the rotor has eccentric motion and flexing the magnetostrictive element to change magnetic field characteristics of the magnetostrictive element. The method further includes generating electrical power through induction based on the change of the magnetic field characteristics of the magnetostrictive element.

DETAILED DESCRIPTION

A detailed description will now be provided. Each of the appended claims defines a separate invention, which for infringement purposes is recognized as including equivalents to the various elements or limitations specified in the claims. Each of the embodiments will now be described in greater detail below, including specific embodiments, versions and examples. This disclosure is not limited to these specific embodiments, versions or examples, which are included to enable a person having ordinary skill in the art to make and use the subject matter of the claims when the disclosure of this patent is combined with available information and technology.

Various terms as used herein are shown below. To the extent a term used in a claim is not defined below, it should be given the broadest definition skilled persons in the pertinent art have given that term as reflected in printed publications and issued patents at the time of filing. Further, unless otherwise specified, all compounds described herein may be substituted or unsubstituted and the listing of compounds includes derivatives thereof.

Further, various ranges and/or numerical limitations may be expressly stated below. It should be recognized that unless stated otherwise, it is intended that endpoints are to be interchangeable. Further, any ranges include iterative ranges of like magnitude falling within the expressly stated ranges or limitations.

Magnetostriction is a property of a ferromagnetic material that causes it to change its shape or dimensions during the process of magnetization. The variation of a material's magnetization due to the applied magnetic field changes the magnetostrictive strain until reaching its saturation value. The reciprocal effect, the response to an applied field of a material when subjected to a mechanical stress, is called the Villari effect or, as used herein, the inverse magnetostrictive effect. Thus, mechanical stress can be converted to a change in the ferromagnetic material's magnetic field. In certain embodiments of the present disclosure, this change in the magnetic field is converted to electricity via induction.

Figure 1:
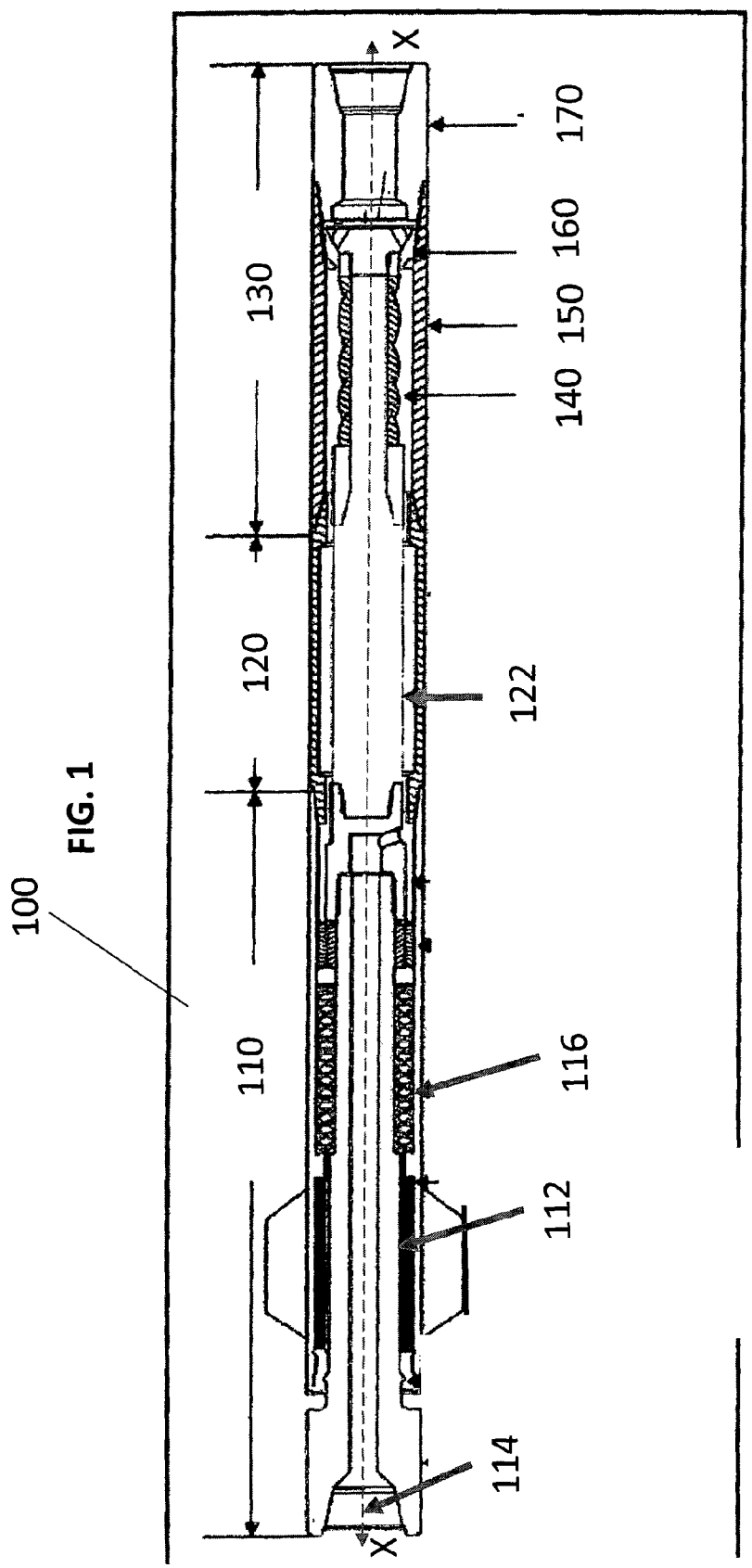
FIG. 1 is a cross-sectional side view of a drill motor.

FIG. 1 is a cross-sectional side view of a drill motor 100, which is a traditional mud motor used to drive a drill bit (not shown). Drill motor 100 defines a longitudinal axis X-X generally along a centerline thereof, and includes bearing section 110, transmission section 120, and power section 130. The bearing section 110 includes a rotatable mandrel 112 that is configured for connection to the drill bit, e.g. the mandrel 112 has a threaded connection 114 at a bottom end thereof. Bearings 116 are provided in the bearing section 110 and may serve, among other objectives, to maintain alignment of the mandrel 112 such that rotation of the mandrel 112 is generally concentric with the drill motor 100. The transmission section 120 includes a transmission 122 therein that serves to transmit mechanical motion, e.g., rotational motion, from the power section 130 to the mandrel 112. Power section 130 includes rotor 140, stator 150, optional rotor catch 160, and top sub 170. As is common with mud motors, the power section 130 is configured such that transmission of a drilling fluid therethrough induces rotational motion of the rotor 140. The induced rotational motion of the rotor 140 may be eccentric rotational motion with respect to the longitudinal axis X-X. The eccentric motion of the rotor 140, caused typically in mud motors by different numbers of lobes of rotor 140 than stator 150, is transferred through the transmission 122 to create concentric rotation of the mandrel 112 and at the drill bit.

Typical mud motors generate hundreds of kilo Watts to assist in drill bit rotation. In one embodiment of the present disclosure, an inverse magnetostrictive device is affixed to the rotor to convert some portion of the power generated to electrical power, which may then be used to power equipment downhole.

Figure 2:
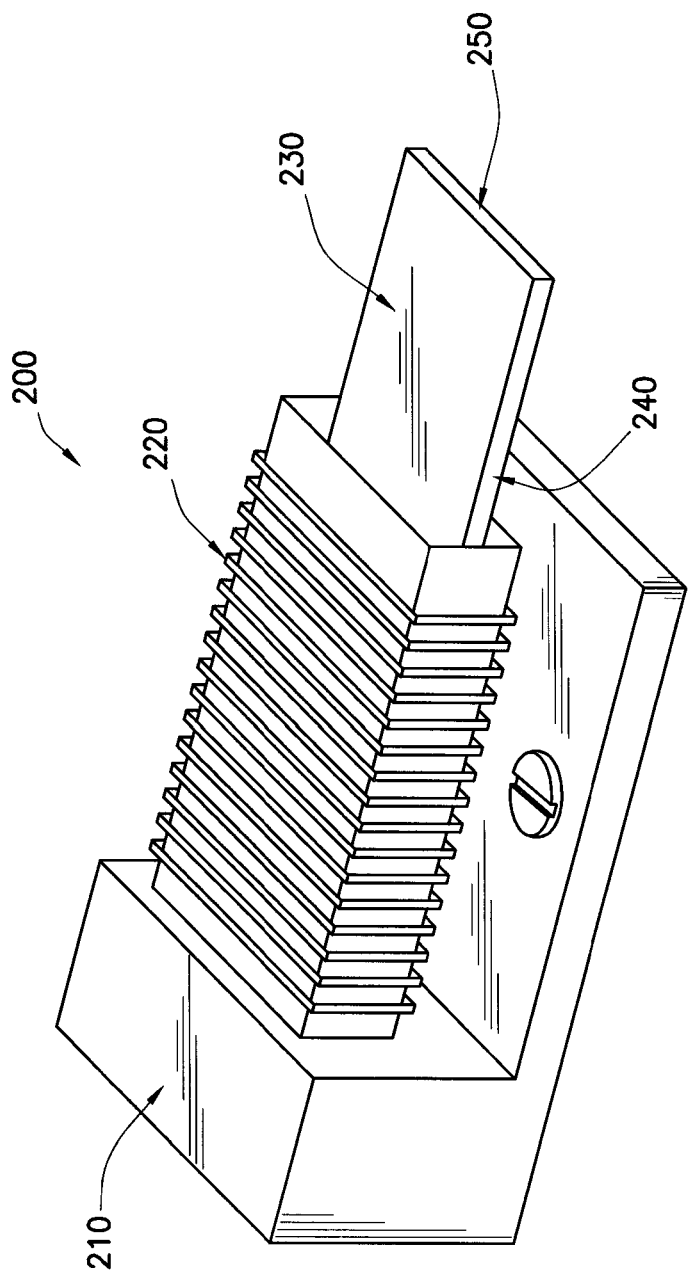
FIG. 2 is a sketch of an inverse magnetostrictive device useful in certain embodiments of the present disclosure.

An example of inverse magneto device useful in some embodiments of the present disclosure is described in *Vibration Energy Harvesting by Magnetostrictive Material for Powering Wireless Sensors*, Thesis of Lei Wang (Raleigh, N.C. 2007), which is incorporated herein in its entirety by reference. FIG. 2 is a sketch of an inverse magnetostrictive device useful in certain embodiments of the present disclosure. Inverse magnetostrictive device 200 includes base 210, pickup coil 220, a magnetostrictive element 230 and copper layer 240. Magnetostrictive element 230 is affixed to base 210 at a fixed end of magnetostrictive element 230 (not shown). The magnetostrictive element 230 extends from the base 210 to a free end or a flexing end 250. Copper layer 240 is affixed to magnetostrictive element 230, such as by lamination. Surrounding magnetostrictive element 230 and copper layer 230 is pickup coil 220, which is affixed to base 210. During operation, flexing end 250 of magnetostrictive element 230 may be induced to move relative to the base 210, and thus relative to the fixed end of the magnetostrictive element 230. Relative movement between the fixed end and the flexing end 250 of the magnetostrictive element 230 stresses, strains and flexes the magnetostrictive element 230, producing a change in the magnetic field of magnetostrictive element 230. Magnetostrictive element 230 may be any appropriate magnetostrictive material, that is a ferrous material in which a mechanical stress to the magnetostrictive material produces a change in the magnetic field of the magnetostrictive material. Examples include iron, iron/gallium, iron/tungsten, and iron/molybdenum. The copper layer in combination with the pickup coil 220 act to convert the change in magnetic field of magnetostrictive element 230 to electrical power, which may then be conducted to equipment in need of electrical power.

Figure 3:
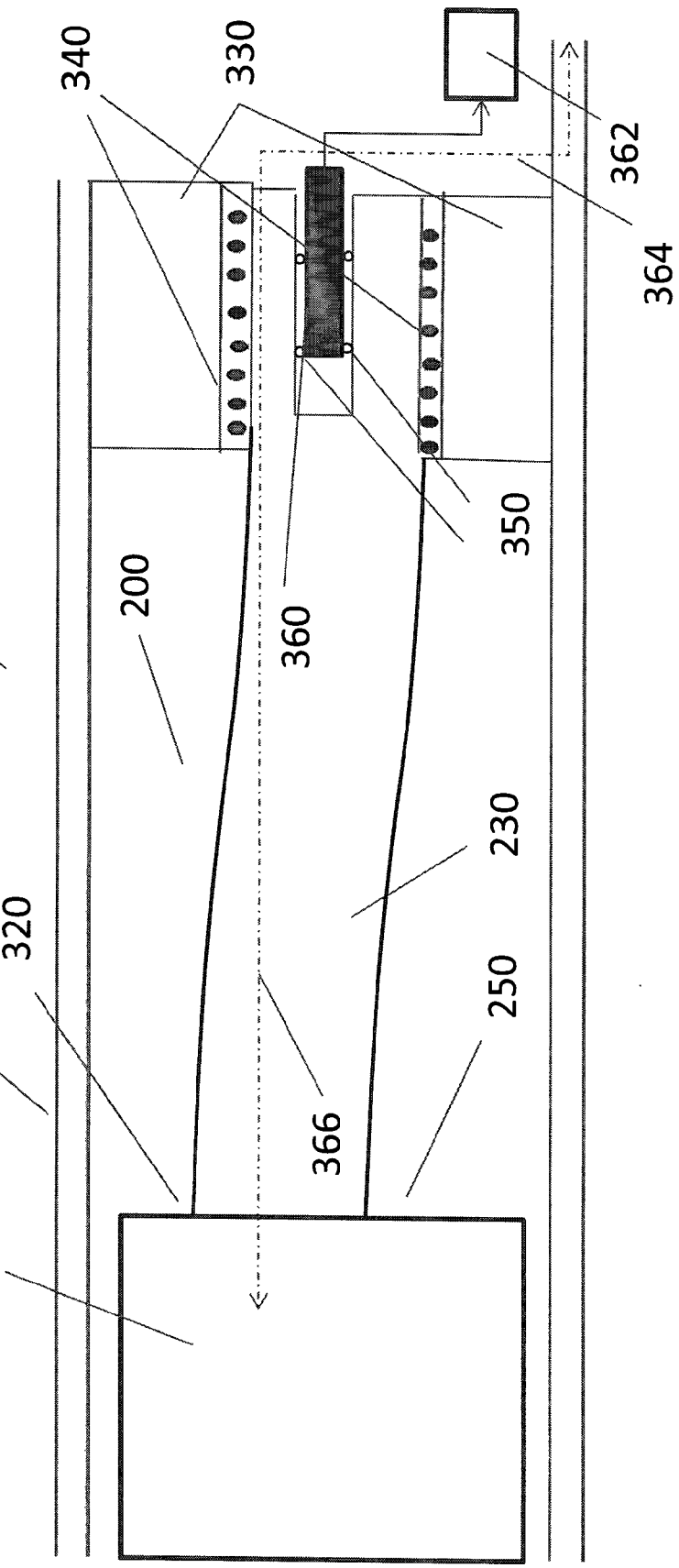
FIG. 3 is a schematic side view of a bottom hole assembly, which includes an inverse magnetostrictive device consistent with certain embodiments of the present disclosure.

FIG. 3 is a side view of bottom hole assembly (BHA) 300 which includes an inverse magnetostrictive device consistent with certain embodiments of the present disclosure. The embodiments of the present disclosure depicted in FIG. 3 are those in which inverse magnetostrictive device 200 is located between the rotor 140 of the drill motor 100 and top sub 170 (FIG. 1). Power section 130 is located, generally centered, within BHA sidewalls 310. The BHA sidewalls 310 may be concentric with respect to the drill motor 100. Rotor end 320 of rotor 140 is attached to flexing end 250 of magnetostrictive element 230. Capture blocks 330 are provided in conjunction with bearings 340, which together serve to hold inverse magnetostrictive device 200 in place, e.g., to hold the base 210 (FIG. 2) of the inverse magnetostrictive device 200 generally centered with respect to BHA sidewalls 310 while still allowing rotation of inverse magnetostrictive device 200. Thus, the base 210 may be rotated generally concentrically with respect to the BHA sidewalls 310. As rotor end 320 of rotor 140 rotates, its eccentric motion causes the flexing end 250 of the magnetostrictive element 230 to rotate with eccentric motion as well, bending the magnetostrictive element 230 into an extended "S" shape. The flexing of magnetostrictive element 230 results in the change in the magnetic field of magnetostrictive element 230 as described above. Contacts 350 conduct electrical power generated by pick up coil 220 (FIG. 2) of inverse magnetostrictive device 200 to fixed conductor 360. In the embodiment shown in FIG. 3, fixed conductor 360 transmits electrical power to an uphole tool 362, including, but not limited to, a measurement while drilling device or a logging while drilling device.

In another embodiment of the present disclosure, rather than transmitting power directly uphole to uphole tool 362 or to top sub 170 (FIG. 1), electrical power generated by inverse magnetostrictive device 200 may be conducted along a conduction path 364 (depicted in phantom) extending through BHA sidewalls 310 to other BHA equipment. In still another embodiment of the present disclosure, electrical power generated by inverse magnetostrictive device 200 may be conducted downhole along a conduction path 366 (depicted in phantom) extending through the motor (rotor), for instance, through a wire that travels along the length of inverse magnetostrictive device 200. In still another embodiment of the present disclosure, a rotor catch, e.g., rotor catch 160, may be affixed to magnetostrictive element 230 instead of attachment to drill motor 100.

In certain embodiments of the present disclosure, the amount of electrical power generated by inverse magnetostrictive device 200 exceeds 10 watts. In other embodiments, the amount of electrical power exceeds 20 watts.

In other embodiments of the present disclosure, the power section of a mud motor may be used as a dedicated power generator, instead of being used as part of a drilling motor. Such embodiments are represented by FIG. 3 as well. For example, the power section 130 depicted in FIG. 3 may be operatively decoupled from a drill bit. In these embodiments, the mud motor may also be used to power other equipment that may not require electrical power.

Figure 4:
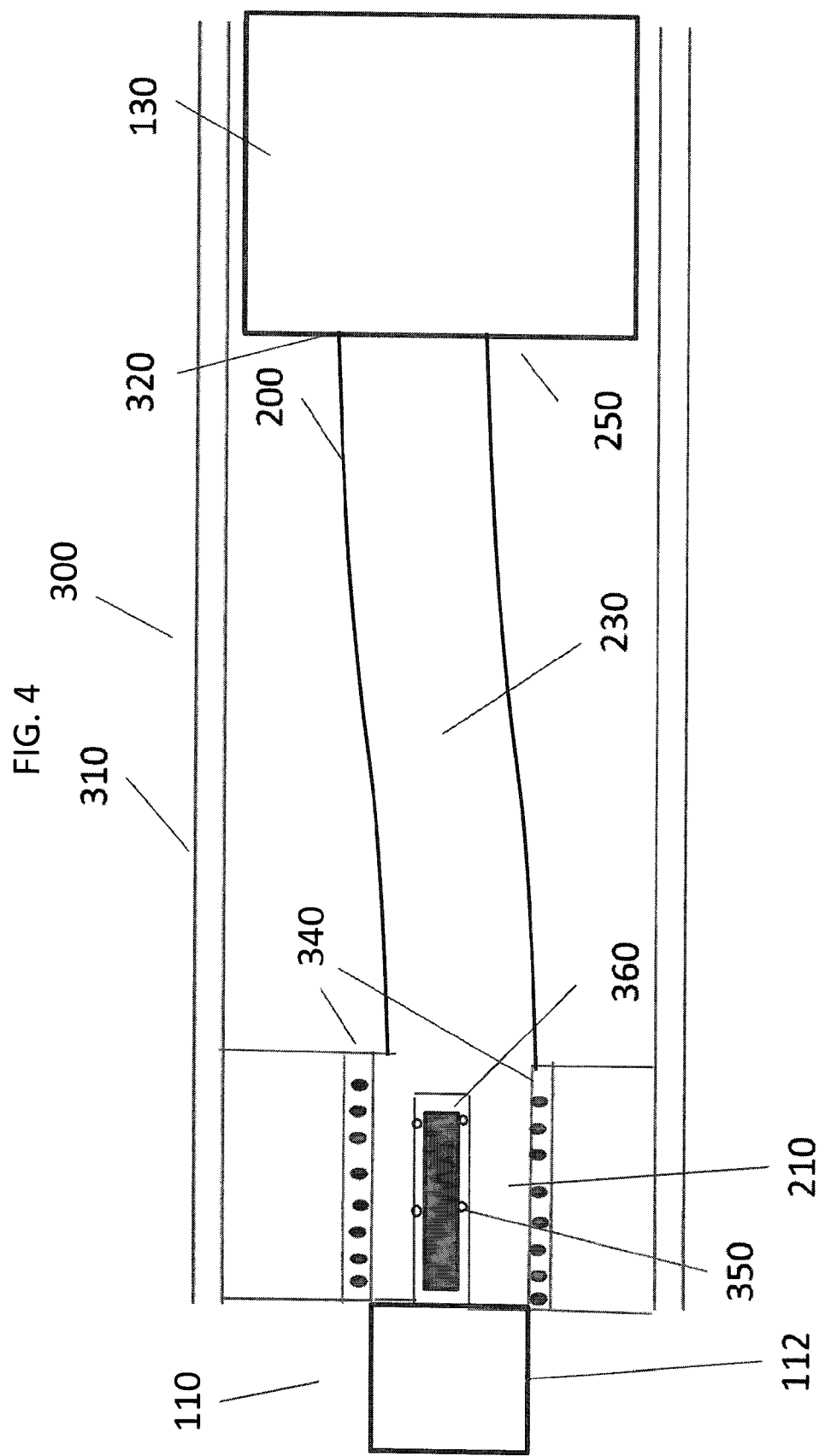
FIG. 4 is a schematic side view of a bottom hole assembly, which includes an inverse magnetostrictive device consistent with certain alternate embodiments of the present disclosure.

In another embodiment of the present disclosure, as illustrated in FIG. 4, inverse magnetostrictive device 200 is located between the rotor 140 of drill motor 100 and bearing section 110. In the embodiment shown in FIG. 4, the flexing end 250 of magnetostrictive element 230 is coupled to the rotor end 320 such that the flexing end 250 may be induced to rotate with eccentric motion. The base 210 of inverse magnetostrictive device 200 is disposed between bearings 340 such that the base 210 is concentrically rotatable within sidewalls 310 of BHA 300. The base 210 is operatively coupled to the mandrel 112 such that concentric rotational motion may be transmitted from the base 210 to the mandrel 112. Thus, magnetostrictive element 230 may also serve as a flexible power transmission shaft, which acts to convert the eccentric motion of rotor end 320 to the concentric motion of the mandrel 112 and the bearing/drill bit of bearing section 110 (FIG. 1). In FIG. 4, the bearings 340 may constitute a part of the bearing section 110 and may serve to maintain concentric alignment of the mandrel 112 as well as the base 210.

It will be recognized that, in other embodiments (not shown), the inverse magnetostrictive device 200 may be coupled to the drill motor 100 in an alternate manner such that the flexing end 250 of the magnetostrictive element 230 is concentrically rotatable and the base 210 is eccentrically rotatable. For example, the flexing end 250 may be disposed within bearings 340 and the base 210 may be affixed to the rotor end 320. Such an arrangement provides the necessary relative motion between the fixed end and flexing end 250 to induce flexing of the magnetostrictive element 230 and the associated power generation of the magnetostrictive device 200. In such embodiments, rather than transmitting power directly to a top sub, electrical power generated by inverse magnetostrictive device 200 may be conducted along BHA sidewalls 310 to other BHA equipment. In still another embodiment of the present disclosure, electrical power generated by inverse magnetostrictive device 200 may be conducted uphole through the motor (rotor), for instance, a wire that travels along the length of inverse magnetostrictive device 200.

While the foregoing is directed to embodiments of the present invention, other and further embodiments of the invention may be devised without departing from the basic scope thereof and the scope thereof is determined by the claims that follow.

What is claimed is:

1. An apparatus for generating electrical power comprising:
   a mud motor defining a longitudinal axis, the mud motor comprising a first rotational component configured for generally eccentric rotational motion with respect to the longitudinal axis and a second rotational component configured for generally concentric rotational motion with respect to the longitudinal axis; and
   an inverse magnetostrictive device, the inverse magnetostrictive device comprising a magnetostrictive element coupled between the first rotational component and second rotational component such that rotational motion of either one of the first and second rotational components induces the magnetostrictive element to flex.

2. The apparatus of claim 1, wherein the first rotational component comprises a rotor configured such that transmission of a drilling fluid through the mud motor induces generally eccentric rotational motion of the rotor, and wherein the magnetostrictive element comprises a flexing end operatively coupled to the rotor such that the flexing end receives eccentric rotational motion therefrom.

3. The apparatus of claim 1, wherein the inverse magnetostrictive device is electrically coupled to an uphole tool such that electrical power generated by flexing the magnetostrictive element may be transmitted to the uphole tool.

4. The apparatus of claim 3, wherein the inverse magnetostrictive device is electrically coupled to the uphole tool through a wire.

5. The apparatus of claim 1, wherein the inverse magnetostrictive device transmits power along bottom hole assembly sidewalls.

6. The apparatus of claim 1, wherein the magnetostrictive element is comprised of a ferrous material.

7. The apparatus of claim 6, wherein the ferrous material is selected from the group consisting of iron, iron/gallium, iron/tungsten, and iron/molybdenum.

8. The apparatus of claim 2, wherein the rotor is operatively coupled to a transmission configured to transmit mechanical motion from the rotor to a drill bit.

9. The apparatus of claim 2, wherein the magnetostrictive element comprises a fixed end opposite the flexing end, wherein the fixed end is operatively coupled second rotational component, and wherein the second rotational component comprises a mandrel configured for concentric rotational motion within a bearing section of the mud motor.

10. A method for generating electrical power comprising:
    providing a mud motor, the mud motor having a rotor, the rotor having a rotor end;
    providing an inverse magnetostrictive device, the inverse magnetostrictive device comprising a magnetostrictive element, wherein the magnetostrictive element has a flexing end and wherein the flexing end of the magnetostrictive element is affixed to the rotor end;
    rotating the rotor with eccentric motion with respect to the mud motor to induce flexing of the magnetostrictive element, thereby changing the magnetic field characteristics of the magnetostrictive element; and
    generating electrical power through induction based on the change of the magnetic field characteristics of the magnetostrictive element.

11. The method of claim 10, wherein the amount of electrical power generated exceeds 10 watts.

12. The method of claim 10, wherein the amount of electrical power generated exceeds 20 watts.

13. The method of claim 10, further comprising powering an uphole tool with the electrical power.

14. The method of claim 13, wherein the uphole tool is a measurement while drilling device or a logging while drilling device.

15. The method of claim 10 further comprising conducting the electrical power through sidewalls of a bottom hole assembly.

16. The method of claim 10 further comprising conducting the electrical power through a wire.

17. The method of claim 10, wherein the flexing of the magnetostrictive element causes the magnetostrictive element to form an extended "S" shape.

18. The method of claim 10, wherein the flexing of the magnetostrictive element is eccentric.

* * * * *